United States Patent [19]

Enomoto et al.

[11] Patent Number: 4,579,639
[45] Date of Patent: Apr. 1, 1986

[54] METHOD OF SENSING THE AMOUNT OF A THIN FILM DEPOSITED DURING AN ION PLATING PROCESS

[75] Inventors: Mitsugu Enomoto; Yoji Yoshikawa, both of Tanashi; Masao Koshi, Sayama, all of Japan

[73] Assignee: Citizen Watch Company Limited, Tokyo, Japan

[21] Appl. No.: 512,499

[22] Filed: Jul. 11, 1983

[30] Foreign Application Priority Data

Jul. 15, 1982 [JP] Japan ................................. 57-123455

[51] Int. Cl.[4] ............................................. C23C 14/54
[52] U.S. Cl. ................................ 204/192 N; 118/715; 204/298; 427/38
[58] Field of Search ............... 204/192 R, 192 N, 298; 427/34, 38, 39; 118/715

[56] References Cited

U.S. PATENT DOCUMENTS 3,670,693  6/1972  Rorick et al. ....................... 118/715
3,734,620  5/1973  Cade ..................................... 356/73
4,399,013  8/1983  Sugita et al. ..................... 204/192 N

FOREIGN PATENT DOCUMENTS 51-106641  9/1976  Japan .................................. 204/298

OTHER PUBLICATIONS

D. M. Mattox, Fundamentals of Ion Plating, *J. Vac. Sci. Technol.*, vol. 10, No. 1, Jan./Feb. 1973, pp. 47–52.
Kennedy et al., Gas–Scattering and Ion–Plating Deposition Methods, *Research/Development*, Nov. 1971, pp. 40–44.
J. J. Bessot, New Vacuum Deposition Techniques, *Metal Finishing*, Mar. 1980, pp. 64–66.

*Primary Examiner*—Andrew H. Metz
*Assistant Examiner*—William T. Leader
*Attorney, Agent, or Firm*—Jordan and Hamburg

[57] ABSTRACT

A method of sensing the amount of a thin film deposited during an ion plating process, based upon either fixing the value of voltage applied to a plasma-generating probe and measuring the current which flows through the probe into the plasma, this current varying in proportion to the rate of formation of the thin film, or fixing the level of current which flows through the probe into the plasma at a fixed value and measuring the voltage which develops at the probe, this voltage varying in proportion to the rate of formation of the thin film. The results of such measurement can be used to control the thickness of a deposited thin film to a desired value.

3 Claims, 7 Drawing Figures

METHOD OF SENSING THE AMOUNT OF A THIN FILM DEPOSITED DURING AN ION PLATING PROCESS

BACKGROUND OF THE DISCLOSURE

The present invention relates to a method of sensing the rate at which a material is converted into the plasma state in an ion plating process and deposited upon a member which is to be plated with a thin film, whereby the final thickness of a plated thin film can be controlled either by varying the duration of the plating operation in accordance with the measurement results or by continuously controlling the rate of deposition to a predetermined value in accordance with continuous monitoring of a measured value.

Ion plating is a widely utilized process for forming a thin film of evaporatively deposited material which is attached with a high degree of strength to a body upon which the plating is performed. For brevity of description, such a body will be referred to in the following as a substrate. The ion plating process has the further advantage of rapidity, so that a high degree of productivity can be attained. In ion plating, an evaporation source is positioned in proximity to a material which is to be evaporatively deposited (this material being referred to in the following as the plating material, for brevity of description), together with a probe and the substrate, the evaporation source, substrate and probe being positioned spaced apart from one another within an evacuated chamber containing a gas which is at a very low pressure. The evaporation source applies heat to the plating material, causing the plating material to evaporate, and a high positive DC voltage or high AC voltage is applied to the probe to cause ionization of the plating material. The electrons produced by this ionization collide at high speed with molecules of the plating material within the chamber, thereby converting the plating material into a plasma. The substrate is held at a potential such that the plating material, in plasma form, is attracted to and deposited thereon, to thereby form a thin film on the substrate.

Such a method has the disadvantage in the prior art that it is difficult to measure the rate at which the thin film is being formed while ion plating is in progress, and hence to set the final thickness of the thin film to a desired value, since the amount of plating material which is actually deposited upon the substrate within a specific time interval (referred to in the following as the effective evaporation amount) will vary in response to variations in certain operating conditions such as the pressure of the gaseous atmosphere within the evacuated chamber. A method which has been adopted to some extent is based upon disposing a quartz crystal vibrator of a quartz crystal oscillator circuit within the evacuated chamber, and monitoring changes which take place in the frequency of oscillation of the oscillator circuit due to plating material being deposited upon the quartz crystal vibrator. However with certain types of plating material such as titanium, such a method has displayed severe disadvantages as will be discussed in more detail hereinafter. There is therefore an urgent requirement for a simple and effective method of measuring the effective evaporation amount of the plating material in an ion plating process, to enable control of the final thickness of a thin film produced by such a process to a predetermined value.

SUMMARY OF THE DISCLOSURE

The present invention has the objective of overcoming the fundamental problem which arises with a prior art ion plating process as described above, i.e. the difficulty of controlling the thickness of a deposited thin film, and enables the rate of formation of such a thin film to be continuously measured, i.e. enables the effective evaporation amount to be continuously measured while ion plating is in progress, in a simple and accurate manner. It is an advantage of the method of the present invention that it is applicable to certain materials such as titanium for which it is difficult to apply the prior art method of measurement based upon a quartz crystal vibrator and oscillator circuit. The method of the present invention can be extended to hold the rate at which a thin film is formed at a fixed value.

These objectives are attained by utilizing the fact that if the voltage applied to the probe of an ion plating apparatus is held constant, then the level of current which flows through the probe into the plasma in the evacuated chamber will vary in proportion to the rate of deposition of the thin film upon the substrate (i.e. in proportion to the effective evaporated amount). Thus, a film of desired thickness can be attained by adjusting the time for which ion plating is carried out in accordance with the results of such current measurement. Alternatively, the value of current flowing through the probe can be compared with a predetermined reference value, and any error between these current values used to control the power supplied to the evaporation source such as to decrease the probe current if it should rise above the reference value, and vice versa. Thus, a form of continuous feedback control can be implemented.

It is also possible to hold the current which flows through the probe into the plasma at a fixed level, and to measure the voltage which is developed at the probe. It has been found that this voltage varies in proportion to the rate of formation of the thin film (i.e. to the effective evaporation amount). In this case, the measured voltage can be compared with a predetermined reference voltage, and any error between these utilized to control the level of power supplied to the evaporation source such as to produce an increase in the probe voltage if that should fall below the reference value, and vice versa. Thus, as in the case of a fixed probe voltage, it is possible to implement continous feedback control of the rate of formation of the thin film to hold that rate at a fixed level. When such control is achieved, then a desired thickness of thin film can be formed by simply setting the duration of ion plating to a suitable fixed value.

The method of the present invention is applicable to an ion plating process in which only the plating material is deposited as the thin film, and also to a process in which the plating material chemically combines with the gaseous atmosphere with the resultant chemical compound being deposited as the thin film on the substrate.

DESCRIPTION OF THE PREFERRED EMBODIMENTS

Figure 1:
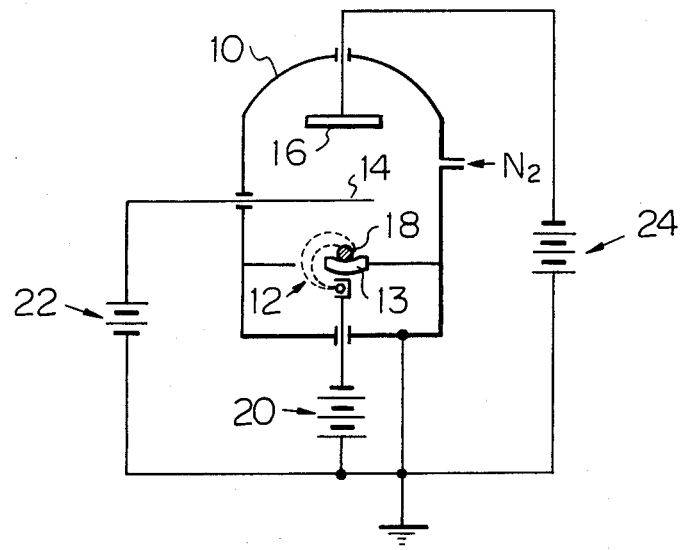
FIG. 1 is a simplified diagram to illustrate the circuit and configuration of a prior art ion plating process.

Before describing embodiments of the present invention, a prior art apparatus and method of ion plating will be discussed, referring to FIG. 1. Here, an evacuated chamber comprising a bell jar 10 contains an evaporation source 12 (which comprises an electron beam evaporation source), a probe 14, and a substrate 16 (the term "substrate" will be applied in the present disclosure to a member upon which a thin film is to be deposited), these being mutually spaced apart. Power is supplied to evaporation source 12 from an evaporation power supply 20, whereby a material 18 that is to be deposited (referred to in the following as the plating material) is subjected to heating and therefore evaporates, while at the same time a positive voltage is applied to probe 14 from power source 22. A flow of a gas (which in this and the following embodiments of the present invention is assumed to be nitrogen) at very low pressure serves to produce a rarified gaseous atmosphere within bell jar 10. Electrons which are emitted from evaporation source 12 and plating material 18 convert the evaporated material into a plasma state, through collisions with the gaseous atmosphere within the bell jar. The evaporated material, or a chemical compound formed by reaction between the gaseous atmosphere within the bell jar and the evaporated material, thereby forms a thin film on substrate 16, which is held at a high level of negative potential from a voltage source 24.

In the example of FIG. 1, an electron beam evaporation source is used as evaporation source 12. This comprises an E-type electron gun, which emits an electron beam by the action of a heater and a high value of negative voltage that is provided from a voltage source 20. This electron beam is focussed by a magnet to impinge on the plating material, denoted by numeral 18, which is disposed upon a water-cooled crucible 13.

It should be noted that the method of the present invention is not limited in its application to such a configuration, but that resistance heating and high-frequency heating types of evaporation source can equally be employed.

Furthermore, in this example, a high value of negative voltage (i.e. 100 V to 200 V) is applied from a DC power supply 24 to substrate 16. However it is also possible to leave substrate 16 in the insulated state, or connected to ground potential. It is also possible to apply a high value of AC voltage to probe 14, rather than a DC voltage, in order to generate a plasma.

When ion plating is carried out with the apparatus of FIG. 1, the effective evaporated amount which is produced from plating material 18 will vary, due to changes in the pressure within bell jar 10, changes in the density of the gaseous atmosphere within the bell jar, or variations in other operating conditions. It should be noted that the term "effective evaporated amount" as used in the present disclosure, signifies the effective amount of the plating material which is formed into a thin film on the substrate within an arbitrary fixed time interval, out of all of the material which is evaporated. Thus, in order to form a thin film which has a predetermined thickness and a predetermined structure, it is necessary to accurately sense the effective evaporated amount of the plating material, and to control this effective evaporated amount to a desired value.

In the prior art, it has been attempted to attain this objective by using a quartz crystal film thickness measurement apparatus, which is based upon changes in the frequency of oscillation of a quartz crystal oscillator circuit. The quartz crystal vibrator element of this oscillator circuit is inserted into the bell jar interior, and the thickness of the deposited thin film is measured by measuring changes in the frequency of oscillation which result from changes in the amount of evaporated material deposited on the quartz crystal vibrator element. The rate of change of the measured thickness is used to predict the effective evaporated amount of the plating material. However, with this prior art method of sensing, the effective evaporated amount is sensed indirectly. In addition, measurement may be impossible in some cases, depending upon the type of plating material which is used.

For example, if titanium (Ti) is used as the plating material, and if a thin film of titanium (or of the nitrogen compound of titanium, TiN) is formed, then when the titanium or TiN is deposited on the quartz crystal vibrator element, operation of that element may be impeded to such an extent that the apparatus will fail to function correctly. In addition, the thin film will readily become separated from the quartz crystal vibrator element. It has therefore been difficult, in the prior art, to control the thickness of a thin film formed in this way to a predetermined value, particularly when the plating material is titanium.

It is an objective of the present invention to overcome these problems which arise with prior art ion plating processes. This is achieved by continuously sensing the effective evaporated amount while ion plating is in progress, in a simple yet accurate manner. The method of the present invention is applicable even when an plating material such as titanium is utilized, which makes it difficult to use a prior art quartz crystal film thickness measurement apparatus. It is also an objective of the present invention to use the results of this sensing to hold the effective evaporated amount at a fixed level. This is achieved by holding an operating parameter of the probe (i.e. the current which flows through the probe into the plasma, or the voltage applied to the probe) at a fixed value, and measuring the resultant value of another operating parameter (i.e. the resultant probe voltage, if the current is held fixed, or the resultant probe current if the voltage is held fixed). It is found that the measured parameter will vary in proportion to the rate of thin film formation on the substrate, i.e. in proportion to the effective evaporation amount.

It is also possible to utilize the present invention to hold the rate of deposition of the thin film at a fixed level. This is accomplished by controlling the level of power which is supplied to the evaporation source in accordance with the level of current flowing in the probe (if the probe voltage is held constant), or in accordance with the value of voltage developed at the probe (if the probe current is held constant).

Figure 2:
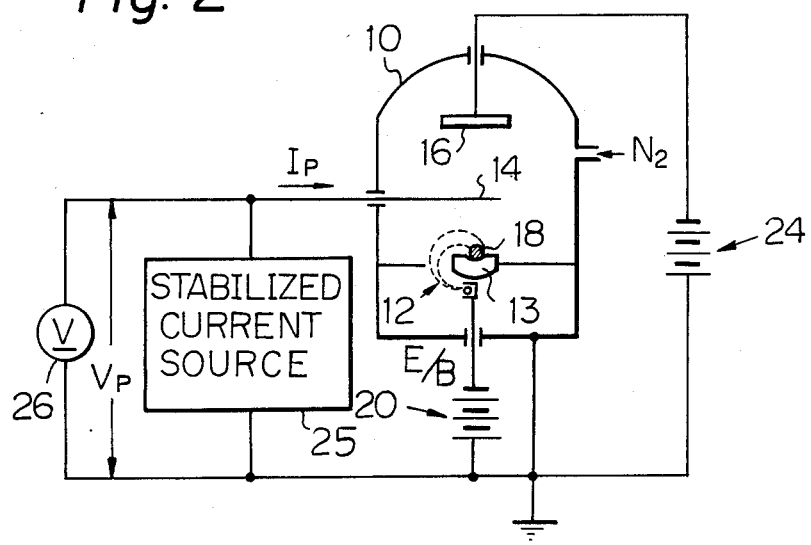
FIG. 2 is a simplified diagram to illustrate the circuit and configuration of a first embodiment of the present invention, for sensing the rate of deposition of a thin film in ion plating.

A first embodiment of the present invention will now be described with reference to FIG. 2.

Figure 3:
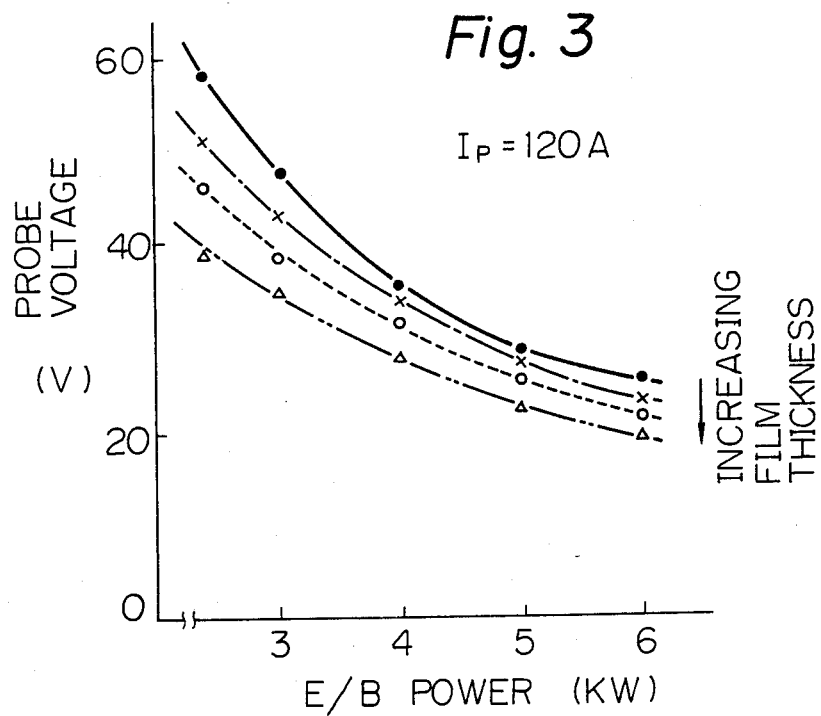
FIG. 3 is a graph showing the relationship between the power supplied to an evaporation source, the probe voltage, and the rate of film thickness increase in an ion plating process, when the probe current is held constant.

The level of current Ip which flows in probe 14 is held constant, by constant current source 25, and a voltage Vp (referred to in the following as the probe voltage) that is developed between probe 14 and ground potential (with bell jar 10 and the crucible of evaporation source 12 being at ground potential) is measured by DC voltmeter 26. This ion plating apparatus embodiment will be described for the case of titanium (Ti) being used as plating material 18, and with nitrogen (N2) being passed into bell jar 10 to thereby form a thin film of TiN on the surface of substrate 16. The relationship between the power (hereinafter referred to as the E/B power) supplied to the evaporation source and the probe voltage Vp is shown in FIG. 3. In FIG. 3, the current level Ip which flows in probe 14 from constant current source 25 is held at 120 mA. Certain operating conditions were varied, including the amount of nitrogen introduced into the bell jar, the bell jar internal pressure, the state of cooling of the crucible of evaporation source 12, the titanium evaporation area, etc, and FIG. 3 shows the relationships between the E/B voltage and probe voltage for these different operating conditions. Each curve corresponds to a specific value of deposited thin film thickness (formed during some arbitrary fixed time interval), and as indicated, the lower the position of a curve, the lower is the corresponding film thickness.

It was found that for each of the operating conditions, if the E/B power is held constant, a fixed thickness is obtained for the thin film if the probe voltage is held fixed. The lower the probe voltage, the greater is the thin film thickness, and it was found that whatever changes were made in other operating conditions, there was almost an exact correspondence between the probe voltage and the thin film thickness (i.e. the effective evaporated amount from the plating material 18) if the E/B power is held fixed.

Thus, by measuring the value of the probe voltage, the effective evaporated amount from plating material 5 can be determined.

Figure 4:
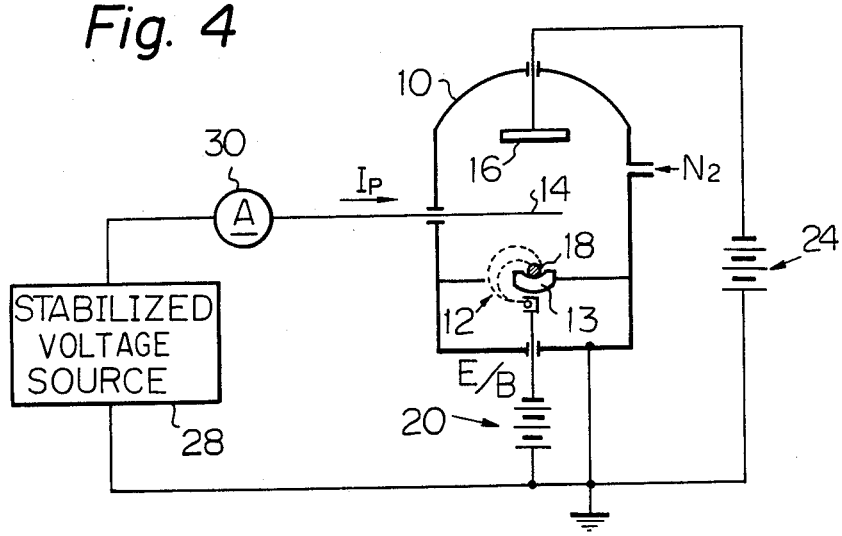
FIG. 4 is a simplified diagram of a second embodiment of the present invention, for sensing the rate of deposition of a thin film in ion plating.
Figure 5:
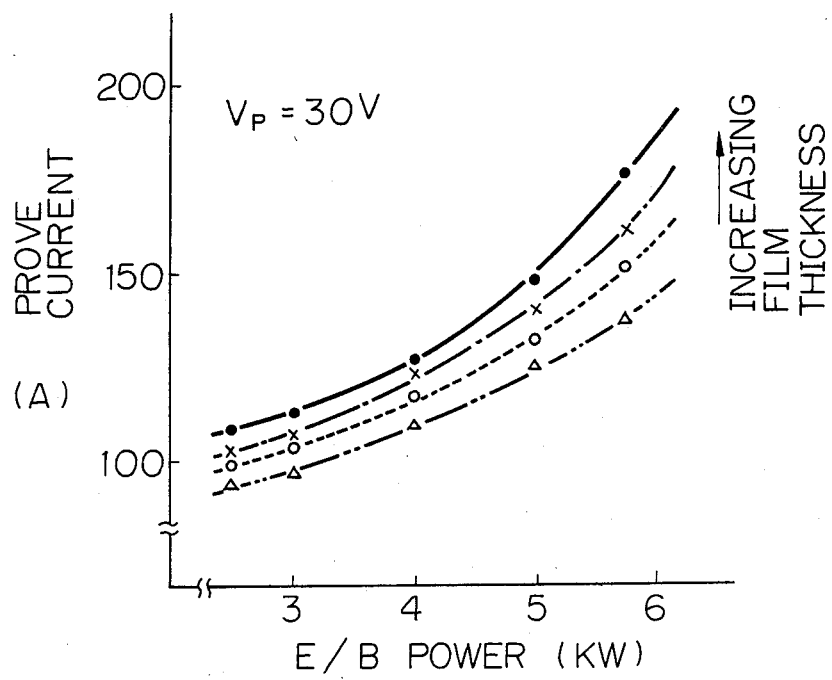
FIG. 5 is a graph showing the relationship between the power supplied to an evaporation source, the probe current and the rate of film thickness increase, when the probe voltage is held constant.

FIG. 4 shows a second embodiment of the present invention, in which the voltage applied to probe 14 is held constant by a stabilized voltage source 28, and the current which flows through probe 14 into the plasma in bell jar 10 is measured by a current meter 30. FIG. 5 shows the relationships between the E/B power and the probe current, for the embodiment of FIG. 4. As in the previous embodiment, titanium is used as the plating material, and nitrogen is passed into the bell jar to thereby form a thin film of TiN. Operating conditions, other than the probe voltage were varied as parameters. It was found in this case that the higher the level of probe current (for a specific value of E/B power) the greater is the thin film thickness deposited during an arbitrary fixed time interval, i.e. the greater is the effective evaporated amount. With the E/B power held constant, there is almost an exact correspondence between the level of probe current and the effective evaporated amount from the plating material. Thus, by measuring the level of probe current Ip, the effective evaporated amount from the plating material can be sensed.

Figure 6:
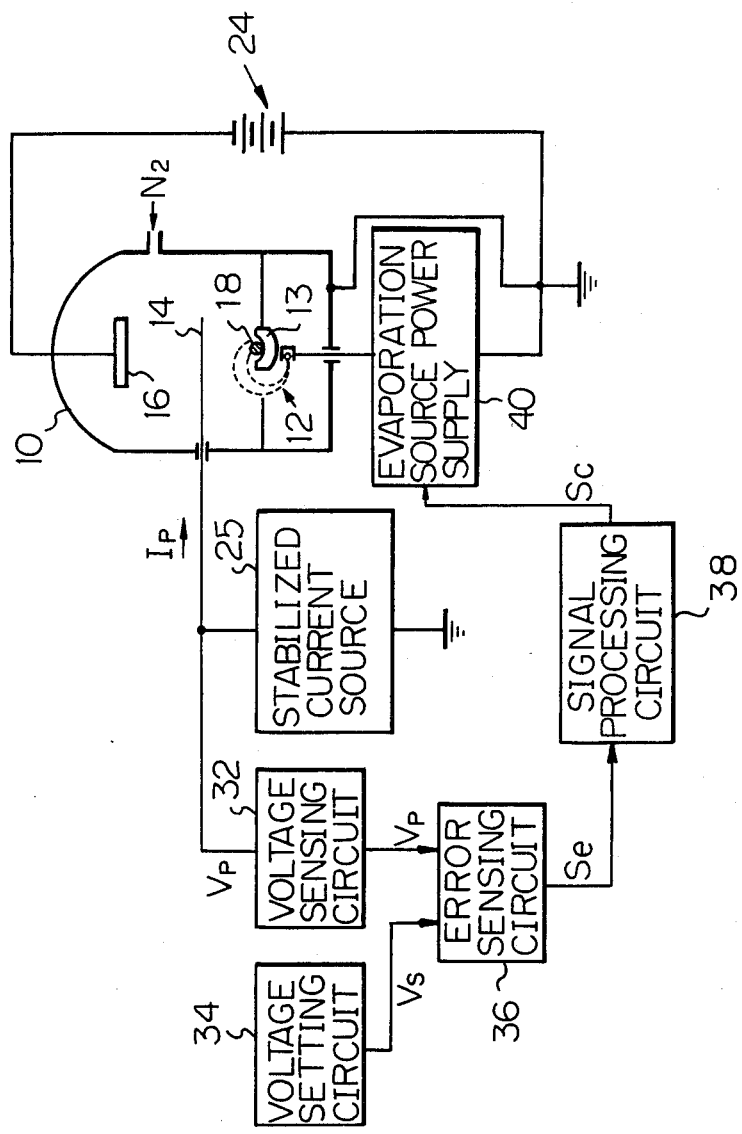
FIG. 6 is a simplified diagram of the circuit and configuration of a third embodiment of the present invention, for holding the rate of thin film formation fixed in an ion plating process, with probe current being held constant.

Referring now to FIG. 6, a third embodiment of an ion plating apparatus according to the present invention is shown, in block diagram form. In this embodiment, as in the embodiment of FIG. 2, a fixed level of current is passed through probe 14 by constant current source 25, while the probe voltage Vp is sensed by a voltage sensing circuit 32. The value of the probe voltage Vs that is necessary to obtain a desired effective evaporated amount from evaporation material 18 is set beforehand, using voltage setting circuit 34. While ion plating is in progress, the difference between the predetermined value of Vs and the actual probe voltage Vp is output as signal Se from an error sensing circuit 14. The latter circuit can comprise a differential amplifier circuit, for example.

Signal Se is transferred through a signal processing circuit, and is thereby converted to a signal Sc. In this embodiment, signal Sc varies in proportion to the level of signal Se, however it is equally possible to arrange signal processing circuit 38 such that signal Sc varies in accordance with the integral of signal Se, or the differential of signal Se. This signal Sc is input to the control terminal of evaporation power supply 40, to thereby control the E/B power that is supplied to evaporation source 12 and thereby hold the probe voltage Vp constant. For example, if the probe voltage Vp should rise above the set reference value Vs, then as can be seen from FIG. 3, the evaporation power supply 40 can be controlled such as to increase the E/B power to thereby reduce the value of voltage Vp and so maintain the set value Vs.

In this way, by controlling operation such as to hold the probe voltage Vp fixed at a set value Vs, then even if other operating conditions should change and even if titanium, for example, is used as an plating material, the effective evaporated amount is held constant. Thus, the thin film thickness formed on substrate 16 during an arbitrary fixed time interval is also held constant.

Figure 7:
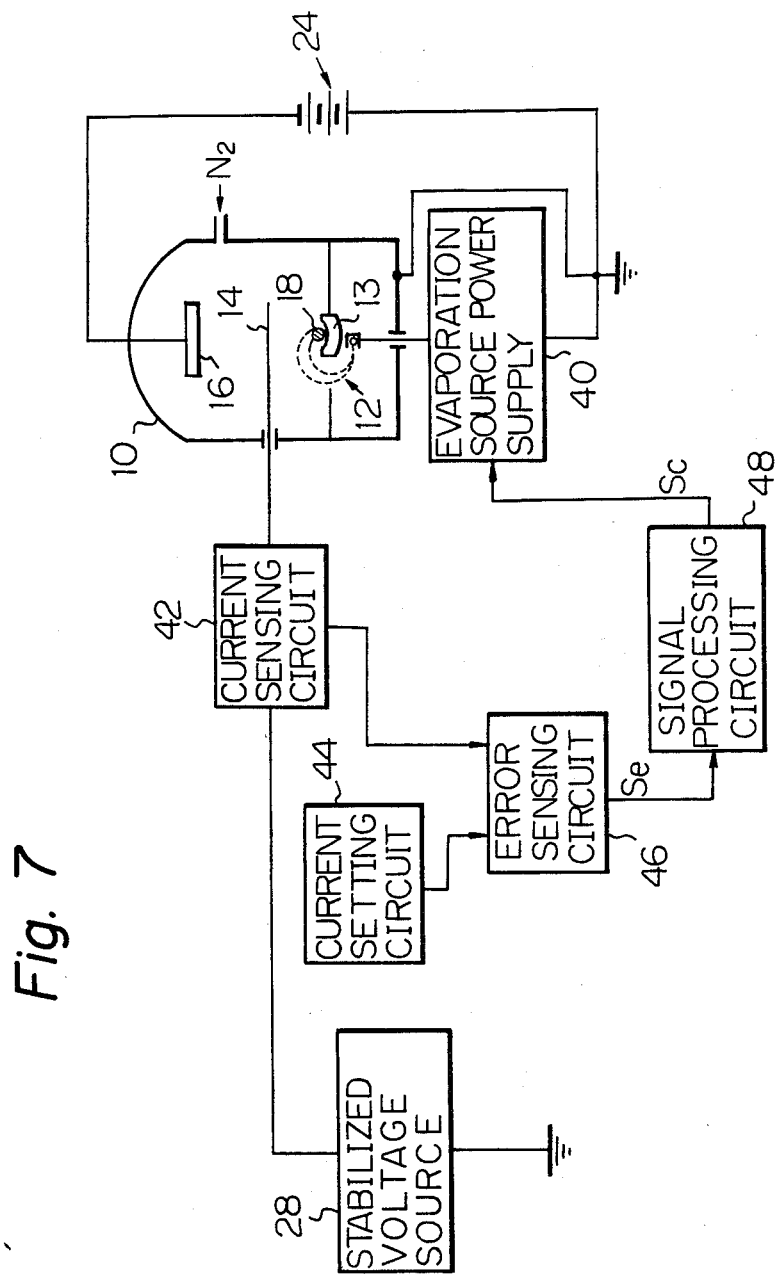
FIG. 7 is a simplified diagram of a fourth embodiment of the present invention, for holding the rate of thin film formation fixed in an ion plating process, with probe voltage being held constant.

It is also possible to replace the constant current source 25 in the example of FIG. 6 with a constant voltage source, to hold the voltage applied to probe 14 at a fixed level, and to use a current meter to sense the probe current Ip and compare this with a predetermined value. In this way, by controlling the evaporation power supply 40 in accordance with the difference between the actual probe current Ip and the predetermined value, Ip can be held constant at the predetermined level, whereby the effective evaporated amount of the plating material is held constant. An embodiment of the present invention to perform such a function is shown in FIG. 7, in which a stabilized voltage source 28 applies a fixed voltage to probe 14. The resultant level of current which flows through probe 14 into the plasma is sensed by a current sensing circuit 42, which produces an output signal indicative of that current level. This output signal is compared with a reference signal level produced by a current setting circuit 44, and an error signal indicative of the difference between these is produced by an error sensing circuit 46. This is transferred through a signal processing circuit 48 to control the level of power applied by evaporation source power supply 40 to evaporation source 12.

Thus for example if the level of current flowing through probe 14 into the plasma should rise above the predetermined value that has been set by current setting circuit 44, then the output signal from signal processing circuit 48 will act to reduce the level of probe current. Thus, as can be understood from the graphs of FIG. 5, the probe current will be thereby reduced until the set level is attained, so that the rate of film thickness increase is held constant.

It should also be noted that in the case, for example, of thin film of TiN being formed on an exterior casing or other part of a timepiece, the color of the thin film will vary under certain conditions. With prior art methods of forming such a thin film, it is very difficult to obtain a desired color of the film. However, with the method of the present invention, the effective evaporated amount of the titanium can be held fixed at a desired value, so that the color of the TiN thin film can be easily controlled together with the thin film thickness.

It should be noted that the present invention is not limited to the formation a thin film of TiN, but can also be applied to the formation of a thin film of some other material, such as Ti, TiC, or silicon (Si), zirconium (Zr), hafnium (Hf), etc. The present invention is also applicable to ion plating for forming a thin film of a chemical compound produced by reactions between the plating material and the gaseous atmosphere within the bell jar.

Thus, as described hereinabove, the present invention enables continuous sensing of the effective evaporated amount of an plating material in a simple and accurate manner while ion plating is in progress, even in the case of a material being used for the plating material (such as titanium) which is unsuitable for application of prior art types of ion plating film thickness measurement apparatus, and also enables the structure and color as well as the thickness of the thin film thus formed to be determined, and thereby easily controlled.

The present invention further enables the effective evaporated amount of a plating material to be held at a fixed level irrespective of changes in operating conditions, while ion plating is in progress, and thereby enables the thickness of a thin film formed during a fixed time interval to be held constant, for thereby enabling the color and structure of the thin film to be held constant.

It should be noted that various changes and modifications to the embodiments of the present invention described hereinabove may be envisaged, which fall within the scope claimed for the invention as detailed in the accompanying claims. The above specification should therefore be interpreted in a descriptive, and not in a limiting sense.

What is claimed is:

1. A method of measuring the rate of deposition of a plating material upon a substrate by ion plating, for thereby controlling said rate of deposition, said substrate being disposed in an evacuated chamber together with a quantity of said plating material, means for evaporating said plating material, and a probe positioned between and separated from said substrate and said quantity of plating material, and with control means being provided operable to vary a level of power applied to said evaporation means for thereby varying the rate of said material evaporation, the method comprising: applying a fixed voltage to said probe while measuring the level of a resultant current flow through said probe into said evaporated material within said evacuated chamber to derive a signal indicative of said current level, and applying said signal to said control means to thereby control the power applied to said evaporation means such as to hold said current at a constant level, to thereby hold said rate of deposition of said plating material at a constant value.

2. A method of measuring the rate of deposition of a plating material upon a substrate by ion plating, for thereby controlling said rate of deposition, said substrate being disposed in an evacuated chamber together with a quantity of said plating material, means for evaporating said plating material, and a probe positioned between and separated from said substrate and said quantity of plating material, and with control means being provided operable to vary a level of power applied to said evaporation means for thereby varying the rate of said material evaporation, the method comprising: passing a fixed level of current through said probe into said evaporated plating material within said evacuated chamber while measuring the level of a resultant voltage developed at said probe, to derive a signal indicative of said voltage level, and applying said signal to said control means to thereby control the power applied to said evaporation means such as to hold said probe voltage at a constant level, to thereby hold said rate of deposition of said plating material at a constant value.

3. A measuring method according to claim 1 or claim 2, in which said plating material is titanium.

* * * * *